United States Patent
Tanimoto et al.

(10) Patent No.: US 11,028,474 B2
(45) Date of Patent: Jun. 8, 2021

(54) METHOD FOR CLEANING SIC MONOCRYSTAL GROWTH FURNACE

(71) Applicant: SHOWA DENKO K.K., Tokyo (JP)

(72) Inventors: Yosuke Tanimoto, Kawasaki (JP); Hideyuki Kurihara, Kawasaki (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 16/065,257

(22) PCT Filed: Dec. 26, 2016

(86) PCT No.: PCT/JP2016/088697
§ 371 (c)(1),
(2) Date: Jun. 22, 2018

(87) PCT Pub. No.: WO2017/115750
PCT Pub. Date: Jul. 6, 2017

(65) Prior Publication Data
US 2019/0003046 A1    Jan. 3, 2019

(30) Foreign Application Priority Data

Dec. 28, 2015 (JP) .............................. JP2015-256287

(51) Int. Cl.
*C23C 16/44* (2006.01)
*C30B 29/36* (2006.01)
(Continued)

(52) U.S. Cl.
CPC ............ *C23C 16/4405* (2013.01); *B08B 5/00* (2013.01); *B08B 9/00* (2013.01); *C23C 14/564* (2013.01);
(Continued)

(58) Field of Classification Search
None
See application file for complete search history.

(56) References Cited

U.S. PATENT DOCUMENTS

| 6,562,183 B1 | 5/2003 | Yamada et al. |
| 2009/0149032 A1 | 6/2009 | Kameda et al. |

(Continued)

FOREIGN PATENT DOCUMENTS

| JP | 2000-355779 A | 12/2000 |
| JP | 2004-224663 A | 8/2004 |

(Continued)

OTHER PUBLICATIONS

English Translation TW201438997 to Oomori et al., accessed on Oct. 2019. (Year: 2014).*

(Continued)

*Primary Examiner* — Eric W Golightly
*Assistant Examiner* — Arlyn I Rivera-Cordero
(74) *Attorney, Agent, or Firm* — Sughrue Mion, PLLC (57) ABSTRACT

A method of cleaning a SiC monocrystal growth furnace provided with an in-furnace substrate composed of a 3C-SiC polycrystal having at least a surface in which an intensity ratio of a (111) plane with respect to other crystal planes is at least 85% but not more than 100% according to powder XRD analysis, the method including flowing a mixed gas of fluorine gas and at least one of an inert gas and air in a non-plasma state through the inside of the SiC monocrystal growth furnace, thereby selectively removing a SiC deposit deposited inside the SiC monocrystal growth furnace, wherein the mixed gas comprises at least 1 vol % but not more than 20 vol % of fluorine gas, and at least 80 vol % but not more than 99 vol % of an inert gas, and a temperature inside the SiC monocrystal growth furnace is from 200° C. to 500° C.

14 Claims, 2 Drawing Sheets

(51) Int. Cl.
    *C30B 23/00*     (2006.01)
    *C23C 14/56*     (2006.01)
    *B08B 5/00*     (2006.01)
    *B08B 9/00*     (2006.01)
    *C30B 25/02*     (2006.01)

(52) U.S. Cl.
    CPC .............. *C30B 23/00* (2013.01); *C30B 29/36* (2013.01); *C30B 25/02* (2013.01)

(56) References Cited

U.S. PATENT DOCUMENTS

| | | | |
|---|---|---|---|
| 2011/0023476 A1* | 2/2011 | Havel | F01K 3/00 60/407 |
| 2012/0031330 A1 | 2/2012 | Tsumori et al. | |
| 2012/0247511 A1 | 10/2012 | Okada et al. | |
| 2016/0002574 A1 | 1/2016 | Oomori et al. | |

FOREIGN PATENT DOCUMENTS

| | | |
|---|---|---|
| JP | 2012-019081 A | 1/2012 |
| JP | 2012-028385 A | 2/2012 |
| JP | 2012-209412 A | 10/2012 |
| JP | 2013-251487 A | 12/2013 |
| JP | 2015-053393 A | 3/2015 |
| KR | 10-2013-0141612 A | 12/2013 |
| KR | 10-2015-0116900 A | 10/2015 |
| TW | 201341572 A | 10/2013 |
| TW | 201438997 A | 10/2014 |
| WO | 2014/125893 A1 | 8/2014 |

OTHER PUBLICATIONS

Office Action for corresponding TW 105143196, dated Jan. 9, 2018.
International Search Report for PCT/JP2016/088697, dated Mar. 21, 2017.
Notice of Allowance dated Mar. 8, 2019 issued by the Intellectual Property Office of Singapore in Application No. 11201805276V.
Communication dated Jul. 18, 2019, issued by the European Patent Office in counterpart application No. 168817525.2, 6 pages.
Communication dated Jan. 13, 2020, from the Korean Intellectual Property Office in application No. 10-2018-7017650, 6 pages.

* cited by examiner

FIG. 1

METHOD FOR CLEANING SiC MONOCRYSTAL GROWTH FURNACE

TECHNICAL FIELD

The present invention relates to a method for cleaning a SiC monocrystal growth furnace.

This application is a National Stage of International Application No. PCT/JP2016/088697 filed Dec. 26, 2016, which claims priority from Japanese Patent Application No. 2015-256287, filed Dec. 28, 2015, the content of which is incorporated herein by reference.

BACKGROUND ART

Silicon carbide (SiC) is used as an important ceramic material in a wide range of fields. In recent years, epitaxial growth techniques of silicon carbide have attracted attention, and in particular, the high dielectric breakdown voltage and reliability under high-temperature operation have led to the development of applications such as low-power consumption transistors.

It is necessary for the silicon carbide used in such applications to be a high-purity monocrystal bulk or film (including both thin films and thick films).

Known methods for forming a silicon carbide monocrystal film include a method for growing a silicon carbide monocrystal film by a chemical reaction between a C-containing gas (such as propane gas) and a Si-containing gas (such as silane gas) using the chemical vapor deposition method (CVD method), and a method for growing a silicon carbide monocrystal film by using monomethyl silane as a raw material in the CVD method.

The preparation of a high-purity silicon carbide monocrystal film using these CVD methods requires a high temperature of at least 1500° C. when the silicon carbide film is formed. Accordingly, a material having a high heat resistance is used for members inside the growth furnace, such as the inner wall of a SiC monocrystal growth furnace (sometimes simply referred to as a "growth furnace" below) and a susceptor on which a wafer is mounted (hereafter, the inner wall and members of a growth furnace are sometimes collectively referred to as "in-furnace substrates"), and the most commonly used material is a carbon base material having a surface that has been coated with a dense polycrystalline SiC by the CVD method (SiC coating).

Here, a SiC monocrystal growth furnace refers to any furnace (vessel or chamber) used for the growth of SiC monocrystals such as SiC monocrystalline films and SiC monocrystalline ingots.

Furthermore, during film growth by the CVD method, silicon carbide may also adhere and become deposited on the in-furnace substrates such as the inner wall of the growth furnace and the susceptor. The silicon carbide deposit (referred to as a "SiC deposit" below) deposited on these substrates may peel and fall off, thereby falling and adhering to the growth surface of the silicon carbide thin film, which interferes with crystal growth or becomes the cause of defects. Accordingly, the SiC deposit deposited on the inner wall of the growth furnace and the like has to be periodically removed. Conventionally, when silicon carbide was deposited on the inner wall of the growth furnace, a removal method has been employed in which either the silicon carbide was peeled and removed using a tool, or the vessel was periodically replaced.

The stripping of the deposited silicon carbide or the replacement of the growth furnace require a very long working time, and since it is necessary to open the reactor to the atmosphere for a long period of time, this caused the productivity to also be affected, including a worsening of yield. Accordingly, cleaning methods for chemically removing silicon carbide that has become adhered to the inner wall and the like of the growth furnace, using a gas that efficiently removes inorganic substances, are being investigated.

Patent Document 1 discloses a method which, by using only bulk silicon carbide as the material of a susceptor used inside the film formation chamber of a silicon carbide film formation device, enables the reuse of the susceptor after removing the silicon carbide deposit deposited on the susceptor by etching with plasmas of fluorine and oxygen.

Patent Document 2 discloses a method for removing a deposit composed of silicon carbide with a fluorine-containing gas, such as nitrogen trifluoride, which has been converted into a plasma in advance, and adjusting the treatment time by analyzing the exhaust gas.

The sublimation recrystallization method (modified Lely method) is known as a method for growing a monocrystal of silicon carbide on a seed crystal to produce a monocrystal ingot (for example, refer to Patent Document 3). In the sublimation recrystallization method, a sublimation raw material is heated to at least 2000° C. in a SiC monocrystal growth furnace, which causes sublimation of the raw material and generates a sublimation gas, and by supplying that sublimation gas to a seed crystal that has been maintained at a temperature which is several tens to several hundreds of degrees Celsius lower than that of the raw material supply unit, a monocrystal is grown on the seed crystal.

This method is the same as the case of forming a monocrystal film of silicon carbide in terms of the fact that the silicon carbide can adhere and become deposited on the in-furnace substrates such as the inner wall of the growth furnace, and therefore requires removal of the deposited SiC deposit, or exchange of the members or the like.

PRIOR ART LITERATURE

Patent Documents

Patent Document 1: Japanese Unexamined Patent Application, First Publication No. 2015-53393
Patent Document 2: Japanese Unexamined Patent Application, First Publication No. 2013-251487
Patent Document 3: Japanese Unexamined Patent Application, First Publication No. 2004-224663

SUMMARY OF THE INVENTION

Problems to be Solved by the Invention

However, Patent Document 1 discloses that the etching can cause etching of not only the silicon carbide deposits, but also of the susceptor itself. Furthermore, Patent Document 1 discloses that it is possible to reduce the average surface roughness Ra by using bulk silicon carbide for the susceptor, which enables the etching rate of the susceptor to be reduced. However, it is very difficult to construct all parts and members of a silicon carbide epitaxial growth furnace that make contact with the reaction gas using only bulk silicon carbide, which makes expansion toward in-situ difficult.

Moreover, Patent Document 2 is an invention that attempts to perform control by recognition of a slight reactivity difference between a deposit composed of silicon carbide and a dense polycrystal that has been coated (by SiC coating) onto the surface of a carbon base material using the CVD method by analysis of an exhaust gas, but prevention of damage to the in-furnace substrates has proven difficult.

As described above, much trial-and-error has been performed with SiC monocrystal growth furnaces to find a method for selectively removing unwanted SiC deposits without damaging the SiC coating on in-furnace substrates.

The present invention has been developed in light of the above problems, and has an object of providing a method for cleaning a SiC monocrystal growth furnace that is capable of selectively removing a SiC deposit, while inhibiting damage to a SiC coating or a SiC bulk that constitutes an in-furnace substrate.

Means for Solving the Problems

In order to achieve the object described above, the present invention employs the following aspects.

(1) A method of cleaning a SiC monocrystal growth furnace by using a gas to clean a SiC monocrystal growth furnace provided with an in-furnace substrate composed of a 3C—SiC polycrystal having at least a surface in which an intensity ratio of a (111) plane with respect to other crystal planes is at least 85% but not more than 100% according to powder XRD analysis, the method including flowing a mixed gas of fluorine gas and at least one of an inert gas and air in a non-plasma state through the inside of the SiC monocrystal growth furnace, thereby selectively removing a SiC deposit deposited inside the SiC monocrystal growth furnace, wherein the mixed gas comprises at least 1 vol % but not more than 20 vol % of fluorine gas, and at least 80 vol % but not more than 99 vol % of an inert gas, and a temperature inside the SiC monocrystal growth furnace is at least 200° C. but not more than 500° C.

(2) The method of cleaning a SiC monocrystal growth furnace according to (1), wherein the inert gas is selected from the group consisting of nitrogen gas, argon gas and helium gas.

(3) The method of cleaning a SiC monocrystal growth furnace according to (2), wherein the inert gas is either nitrogen gas or argon gas.

Effects of the Invention

The method for cleaning a SiC monocrystal growth furnace of the present invention enables a method for cleaning a SiC monocrystal growth furnace to be provided that is capable of selectively removing SiC deposits, while inhibiting damage to a SiC coating or a SiC bulk that constitutes an in-furnace substrate.

EMBODIMENTS FOR CARRYING OUT THE INVENTION

A configuration of a method for cleaning a SiC monocrystal growth furnace according to the present invention is described below with reference to the drawings. The drawings used in the following description may be drawn with specific portions enlarged as appropriate to facilitate comprehension of the features, and the dimensional ratios and the like between the constituent elements may differ from the actual values. Further, the materials and dimensions and the like presented in the following description are merely examples, which in no way limit the present invention, and may be altered as appropriate within the scope that yields the effects of the invention.

A method for cleaning a SiC monocrystal growth furnace according to an embodiment of the present invention is a method for using a gas to clean a SiC monocrystal growth furnace provided with an in-furnace substrate composed of a 3C—SiC polycrystal having at least a surface in which an intensity ratio of a (111) plane with respect to other crystal planes is at least 85% but not more than 100% according to powder XRD analysis, the method including flowing a mixed gas of fluorine gas and at least one of an inert gas or air in a non-plasma state through the inside of the SiC monocrystal growth furnace, thereby selectively removing a SiC deposit deposited inside the SiC monocrystal growth furnace.

Here, as mentioned above, a "SiC monocrystal growth furnace" includes, without limitation, any furnace capable of growing a SiC monocrystal, and examples include a furnace (vessel or chamber) provided in a film formation device for SiC monocrystal films including SiC epitaxial films, or in a SiC monocrystal (ingot) production device. A film formation device for SiC monocrystal films generally uses a method that includes inductively heating a susceptor to approximately 1400 to 1600° C. by using a high-frequency power supply, placing the SiC substrate on the susceptor, and then introducing a raw material gas.

Further, as mentioned above, an "in-furnace substrate" includes the inner wall of the SiC monocrystal growth furnace and the members inside the SiC monocrystal growth furnace. Examples of the in-furnace substrate to which the cleaning method of the present invention can be applied include substrates that are able to withstand high-temperature conditions of at least 1500° C., in which at least a portion is composed of a carbon base material and the surface of that carbon base material is coated with a silicon carbide protective film.

Moreover, an "in-furnace substrate composed of a 3C—SiC polycrystal having at least a surface in which an intensity ratio of a (111) plane with respect to other crystal planes is at least 85% but not more than 100% according to powder XRD analysis" includes both an in-furnace substrate having a surface coated with a 3C—SiC polycrystal having an intensity ratio of the (111) plane with respect to the other crystal planes of at least 85% but not more than 100% according to powder XRD analysis (in other words, an in-furnace substrate having a portion composed of a material different from the 3C—SiC polycrystal), and an in-furnace substrate composed solely of a 3C—SiC polycrystal having an intensity ratio of the (111) plane with respect to the other crystal planes of at least 85% to 100% according to powder XRD analysis. The former is an in-furnace substrate having a 3C—SiC polycrystal coating, while the latter is an in-furnace substrate composed of a 3C—SiC polycrystal bulk.

Furthermore, a "non-plasma state" refers to a state where a substance is not in a plasma state.

Moreover, a "SiC deposit deposited inside the SiC monocrystal growth furnace" represents a SiC deposit deposited on the inner wall of the SiC monocrystal growth furnace or on a member inside the SiC monocrystal growth furnace. Therefore, it includes not only a SiC deposit deposited on the "in-furnace substrate composed of a 3C—SiC polycrystal having at least a surface in which an intensity ratio of a (111) plane with respect to other crystal planes is at least 85% but not more than 100% according to powder XRD analysis", but also a SiC deposit deposited on other in-furnace substrates.

In a "3C—SiC polycrystal in which an intensity ratio of a (111) plane with respect to other crystal planes is at least 85% but not more than 100% according to powder XRD analysis", although the "other crystal planes" represent all of the crystal planes other than the (111) plane, the (200) plane, the (220) plane, and the (311) plane are frequently observed.

Here, "3C—" refers to a cubic system.

From the perspective of inhibiting damage to a 3C—SiC polycrystal on the surface of an in-furnace substrate, the effect of the present invention is readily obtained when the intensity ratio of the (111) plane with respect to the other crystal planes is at least 90% according to powder XRD analysis, and the effect is more readily obtained when it is at least 95%.

The SiC deposit to be removed by the present invention contains SiC as the main component, and more specific examples include unnecessary SiC deposits that are incidentally deposited on the surface of an in-furnace substrate when thin films, thick films, powders, and whiskers and the like are produced using methods such as the chemical vapor deposition method (CVD method), organic metal vapor phase epitaxy (MOCVD method), sputtering method, sol-gel method and vapor deposition method.

When the cleaning method of the present invention is applied, it is acceptable for unnecessary deposits other than the SiC deposit to also be removed.

The SiC deposit to which the present invention is applied is a 3C—SiC polycrystal having an intensity ratio of the (111) plane with respect to the other crystal planes of less than 85% according to powder XRD analysis, and as an example, the intensity ratio may be at least 70% but less than 85%. Although the other crystal planes represent all of the crystal planes other than the (111) plane, the (200) plane, the (220) plane, and the (311) plane are frequently observed.

Although the evaluation method of the powder XRD analysis described above is not particularly limited, in one example, the device may use an X'pert Pro MPD manufactured by PANalytical using a Cu Kα X-ray source operating at an output of 45 kV-40 mA, a concentration optical system, and a semiconductor detector, and analysis may be performed with a scanning area of 2θ: 20 to 100 deg, a step size of 0.01 deg, and a scanning speed of 0.1 deg/min. The intensity of the respective crystal planes is evaluated using peak heights.

The method for cleaning a SiC monocrystal growth furnace of the present invention can be applied to the removal of SiC deposits deposited on the inner wall of production devices that tend to be prone to the deposition of unnecessary deposits, susceptors for mounting semiconductor wafers, silicon carbide film forming devices that form thin films on semiconductor devices, coating tools and the like, and the inner walls and accessory components of silicon carbide production devices that produce whiskers, powders and the like. Furthermore, the method can also be applied to unnecessary SiC deposits adhered to the inner walls and accessory components of production devices that perform crystal growth of not only thin films and thick films of silicon carbide, but also large-scale bulk such as hexagonal SiC wafers and the like. Among these, application to film formation devices is preferable, and in particular, application to SiC deposits deposited on the inner walls and accessory components of film formation devices that perform epitaxial film growth of silicon carbide, in which the film formation is performed under high-temperature conditions, is more preferable. Among these, application to the inner walls of production devices that tend to be prone to the deposition of unnecessary deposits and susceptors for mounting semiconductor wafers is particularly preferable.

Although it was known that the SiC deposits adhered to the inner wall of a SiC monocrystal growth furnace and the SiC film (SiC coating film) constituting the inner wall are both SiC polycrystals, clear differences between them were not evident, and at best there was considered to be a difference in only the surface roughness Ra. However, according to that evaluation method, since a SiC deposit having an equivalent surface roughness to the SiC coating film constituting the inner wall cannot be distinguished, the cleaning method could not be correctly evaluated, and in an actual device, the expected effect could not be obtained, that is, a reduction in crystal defects in actual silicon carbide monocrystal growth could not be confirmed.

Accordingly, the inventors of the present invention performed various analyses and confirmations to clarify the structural differences between SiC deposits adhered to the inner wall of the SiC monocrystal growth furnace and the SiC coating film constituting the inner wall, and found that although both are polycrystals of the same 3C—SiC, the structures can be quantitatively distinguished according to powder XRD analysis, and the difference between them is strongly apparent in the degree of orientation of the (111) crystal orientation.

The SiC coating film constituting the inner wall is a polycrystal of 3C—SiC, the crystal orientation thereof has a strong (111) orientation, and the intensity ratio of the (111) plane with respect to the other crystal planes is at least 85% but not more than 100% according to powder XRD analysis. Here, although the other crystal planes represent all of the crystal planes other than the (111) plane, the (200) plane, the (220) plane, and the (311) plane are frequently observed. This means that, since crystal planes are unified, the surface reactivity thereof is similar to that of a monocrystal. As a result, it can be considered that the structural and chemical stability can be maintained at a high level.

On the other hand, although unwanted SiC deposits are the same 3C—SiC polycrystal, the crystal orientation is almost unoriented. The intensity ratio of the (111) plane having the strong orientation in the SiC coating film constituting the inner wall is less than 85%. Here, although the other crystal planes represent all of the crystal planes other than the (111) plane, the (200) plane, the (220) plane, and the (311) plane are frequently observed. Since the SiC deposit is almost unoriented with respect to the SiC coating film constituting the inner wall, it can be considered to have inferior structural and chemical stability. However, the SiC deposit is not completely unoriented, and it is thought that the slightly discernable orientation of the (111) plane is due to the effect of the orientation of the SiC coating film constituting the inner wall.

In the method for cleaning a SiC monocrystal growth furnace of the present invention, by structurally distinguishing between the SiC coating film or the SiC bulk material that constitutes the in-furnace substrate and the unwanted SiC deposits, it is possible to selectively remove only the unwanted SiC deposits having inferior structural and chemical stability.

In particular, deposits containing SiC deposited on the surface of the in-furnace substrate can be efficiently and selectively removed by using fluorine gas diluted to a predetermined concentration range while heating the in-furnace substrate to a predetermined temperature range using a heater or the like. The mechanism of removal of the unnecessary deposits deposited on the in-furnace substrate is thought to be a reaction of the fluorine radicals generated by thermal decomposition of the fluorine with the SiC in the deposits, followed by removal as $SiF_4$ or $CF_4$.

However, despite the degree of crystal orientation of the SiC coating film or the SiC bulk material constituting the in-furnace substrate being different from that of the SiC deposits, they are the same in the aspect that both are 3C—SiC, and therefore if a 100% $F_2$ gas is used, the reactivity is too strong and the SiC coating film, the SiC bulk material and the SiC deposit are all removed without distinction, meaning an optimal selectivity ratio is not achieved.

Accordingly, the inventors of the present invention confirmed that by using a mixed gas in which $F_2$ gas is diluted with an inert gas as the etching gas, a sufficient selectivity ratio is obtained in a range where the fluorine concentration is at least 1 vol % but not more than 20 vol %, and preferably at least 5 vol % but not more than 15%. By using $F_2$ gas that has been diluted to this concentration range, a clear difference in the etching rate between the dense polycrystalline SiC film or SiC bulk material and the non-dense polycrystalline SiC deposits can be provided. In other words, by using this difference in the etching rate, no substantial etching of the SiC coating film or SiC bulk material constituting the in-furnace substrate occurs, and the SiC deposits adhered to the surface can be etched and removed.

The dilution gas used in the present invention may use an inert gas, air, or an inert gas and air. Although the inert gas is not particularly limited, examples include nitrogen gas ($N_2$), argon gas (Ar), and helium gas (He). Among these, $N_2$ and Ar are preferable from the perspective of economic viability and availability. A plurality of types of inert gases may be used.

The reaction temperature during the cleaning of the present invention (the temperature of the in-furnace substrate on which the deposit containing SiC is deposited (the temperature inside the SiC monocrystal growth furnace)) is preferably at least 200° C. but not more than 500° C. Within this temperature range, a sufficient cleaning performance is obtained, the difference in etching rates is sufficient, energy is not wasted, and running costs such as power consumption are not increased. A range of at least 250° C. but not more than 400° C. is more preferable, and a range of at least 250° C. but not more than 350° C. is even more preferable.

The reaction temperature can be controlled, for example, by a heater installed around the periphery of the SiC monocrystal growth furnace. The heater may use a heating unit that heats the entire SiC monocrystal growth furnace, or may use a heating unit that only heats a heating target member that then heats the deposit by heat transfer. It is preferable to install a sensor near the deposit. If the sensor cannot be brought into direct contact with the gas, an insertion tube or the like may be used.

The pressure during the cleaning of the present invention is not particularly limited. Although cleaning is usually performed under atmospheric pressure, for example, a pressure of at least −0.10 MPaG but not more than 0.3 MPaG may also be applied.

The flow rate of the cleaning gas (mixed gas) is not particularly limited, but the linear velocity (LV) is preferably at least 0.1 m/min but not more than 10 m/min.

The cleaning method of the present invention can be applied to the removal of SiC deposits deposited on silicon carbide film forming devices that form thin films on semiconductor devices, coating tools and the like by the CVD method, and the inner walls and accessory components of silicon carbide production devices that produce whiskers, powders and the like. Furthermore, the method can also be applied to unnecessary SiC deposits adhered to the inner walls and accessory components of production devices that perform crystal growth of not only thin films and thick films of silicon carbide, but also large-scale bulk such as hexagonal SiC wafers and the like. Among these, application to film formation devices is preferable, and in particular, application to the removal of SiC deposits deposited on the inner walls and accessory components of film formation devices that perform epitaxial film growth of silicon carbide, in which the film formation is performed under high-temperature conditions, is more preferable.

The effects of the present invention will be made clearer below by way of examples. The present invention is in no way limited to the following examples, and modifications can be appropriately made within the scope that yields the effects of the present invention.

Figure 1:
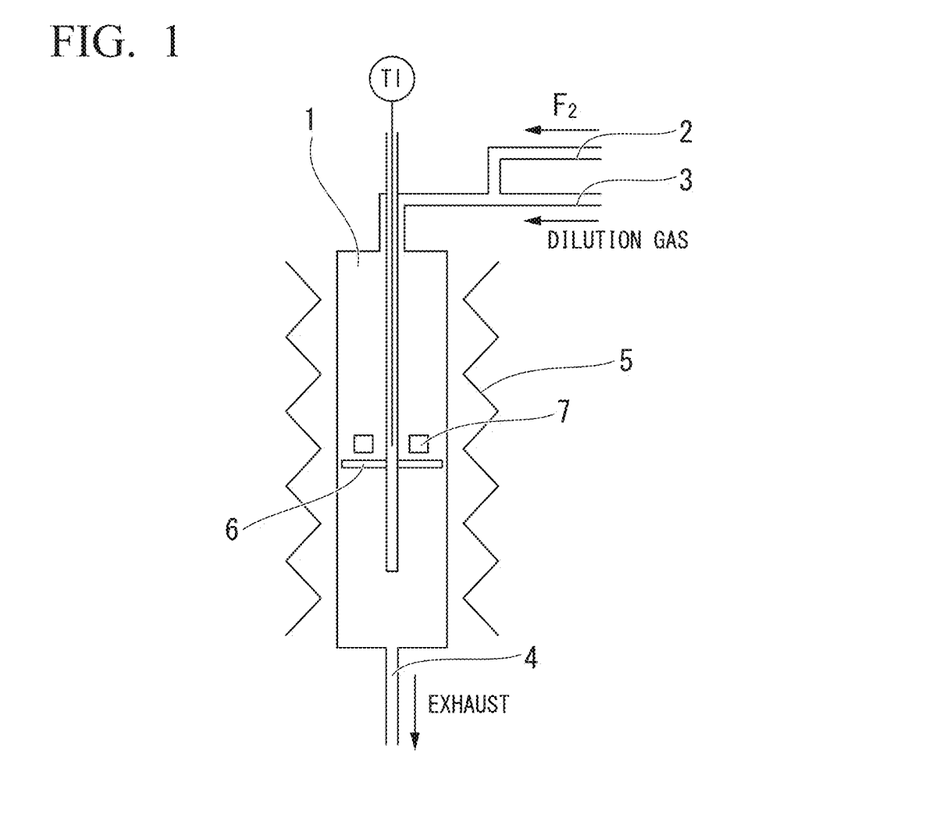
FIG. 1 is a schematic cross-sectional view of a reaction furnace used in the cleaning tests.

FIG. 1 shows a cross-sectional schematic view of a reaction furnace used in the cleaning tests.

The reaction furnace uses an external heating-type vertical reaction furnace provided with a cylindrical reaction tube 1 (formed from nickel). A fluorine gas supply unit 2 and a dilution gas supply unit 3 that supply cleaning gas are connected to the cylindrical reaction tube 1, and an exhaust unit 4 that discharges gas from the reaction tube is provided downstream of the reaction tube 1. Further, an induction heating coil 5 is installed as an external heater on the outer periphery of the reaction tube 1, resulting in a configuration in which the inside of the reaction tube can be heated by the induction coil. The cleaning tests were performed by mounting a sample 7 (evaluation samples and control samples) on a mounting stage 6 inside the reaction tube.

Example 1

In a SiC monocrystal growth furnace having an in-furnace substrate formed from a carbon base material that has been SiC coated, a section of the substrate on which no deposit had been deposited was cut to a size of 1 cm square to prepare a control sample. A SiC epitaxial growth process was repeatedly performed in the furnace, and an in-furnace substrate on which a SiC deposit had been deposited was cut to a size of 5 mm square to prepare the evaluation sample.

These two samples were analyzed by powder XRD analysis. The normal SiC coating film of the control sample was a polycrystal of 3C—SiC, and the intensity ratio of the (111) plane was 99%. In contrast, although the surface of the deposit on the evaluation sample was also a polycrystal of 3C—SiC, the intensity ratio of the (111) plane was 76%. The (200) plane, the (220) plane, and the (311) plane were observed as crystal orientation planes in addition to the (111) plane.

The powder XRD analysis device used was an X'pert Pro MPD manufactured by PANalytical, which used a Cu Kα X-ray source operating at an output of 45 kV-40 mA, a concentration optical system, and a semiconductor detector, and analysis was performed with a scanning area of 2θ: 20 to 100 deg, a step size of 0.01 deg, and a scanning speed of 0.1 deg/min.

Figure 2:
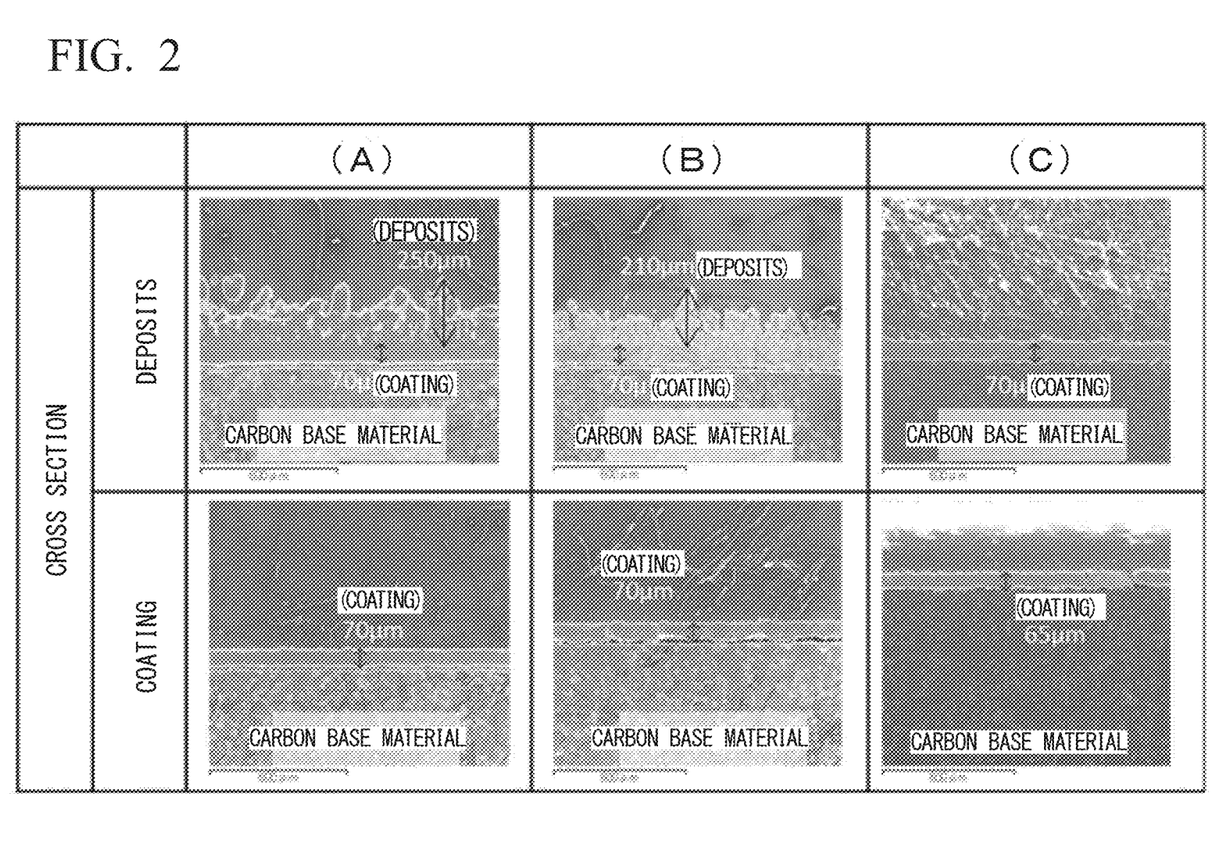
FIG. 2 shows cross-sectional SEM images of sample used in the cleaning tests, where the lower row represents SEM images of a control sample, the upper row represents SEM images of an evaluation sample, column (A) shows the samples before the cleaning test, (B) shows the samples after the cleaning test according to Example 1, and (C) shows the samples after the cleaning test according to Example 2.

As shown in (A) of FIG. 2, the results of SEM (Scanning Electron Microscope) observations of the cross-sections revealed that the thicknesses of the SiC coating films were both 70 μm, while the thickness of the SiC deposit on the evaluation sample was approximately 250 μm.

These two samples were installed on a sample mounting stage at a central position inside the nickel (Ni) reaction tube (ø: ¾ in, length: 30 mm) with an insertion tune shown in FIG. 1. A thermocouple T1 was installed inside the insertion tube in the vicinity of the sample installation position.

The reaction tube was heated to 280° C. using an electrical furnace, and under atmospheric pressure conditions, a gas having a $F_2$ concentration of 10 vol % and a $N_2$ concentration of 90 vol % was flowed for 60 min at a flow rate of 180 ml/min such that the linear velocity (LV) was 1 m/min. As a result, the SiC deposit layer was reduced to 210 μm as shown in (B) of FIG. 2, but the SiC coating film was unchanged from 70 μm. In other words, since the measurement limit here is 5 μm, the amount of reduction in the SiC coating film was less than 5 μm.

The etching rate was 0.67 μm/min for the SiC deposit layer and <0.08 μm/min for the SiC coating film (etching amount of less than 5 μm/60 min), and the etching rate ratio of the SiC deposit layer relative to the SiC coating film was >8.4.

Example 2

With the exception of altering the flow time of the cleaning gas to 350 min, the cleaning test was performed under the same conditions as Example 1. As a result, as shown in (C) of FIG. 2, the SiC deposit layer disappeared, but the thickness of the SiC coating film was 65 μm.

The etching rate was at least 0.71 μm/min for the SiC deposit layer and 0.014 μ/min for the SiC coating film, and the etching rate ratio of the SiC deposit layer relative to the SiC coating film was at least 51.

Example 3

A SiC coating film having a different crystalline orientation intensity, that is, having an intensity ratio of 95% for the (111) plane according to powder XRD analysis, was used as the SiC coating film for the in-furnace substrate. The intensity ratio of the (111) plane crystal orientation of the SiC deposit layer at that time was 73%.

With the exception of altering the flow time of the gas to 200 min, the cleaning test was performed under the same conditions as Example 1. The results of an SEM observation of the cross-sections revealed that the thicknesses of the SiC coating films were both 70 μm, and the thickness of the SiC deposit on the evaluation sample was approximately 250 μm, the same as in Example 1.

As a result, the SiC deposit layer was reduced to 95 μm, but the SiC coating film was only reduced to 66 μm.

The etching rate was 0.78 μm/min for the SiC deposit layer and 0.020 μm/min for the SiC coating film, and the etching rate ratio of the SiC deposit layer relative to the SiC coating film was 39.

Example 4

A SiC coating film having a different crystalline orientation intensity, that is, having an intensity ratio of 90% for the (111) plane according to powder XRD analysis, was used as the SiC coating film for the in-furnace substrate. The intensity ratio of the (111) plane crystal orientation of the SiC deposit layer at that time was 70%.

With the exception of altering the flow time of the gas to 200 min, the cleaning test was performed under the same conditions as Example 1. The results of an SEM observation of the cross-sections revealed that the thicknesses of the SiC coating films were both 70 μm, and the thickness of the SiC deposit on the evaluation sample was approximately 250 μm, the same as in Example 1.

As a result, the SiC deposit layer was reduced to 80 μm, but the SiC coating film was only reduced to 65 μm.

The etching rate was 0.85 μm/min for the SiC deposit layer and 0.025 μm/min for the SiC coating film, and the etching rate ratio of the SiC deposit layer relative to the SiC coating film was 34.

Example 5

With the exception of altering the gas composition to a $F_2$ concentration of 5 vol % and a $N_2$ concentration of 95 vol %, the cleaning test was performed under the same conditions as Example 1. As a result, the SiC deposit layer was reduced to 220 μm, but the SiC coating film was maintained at 70 μm. In other words, since the measurement limit here is 5 μm, the amount of reduction in the SiC coating film was less than 5 μm.

The etching rate was 0.50 μm/min for the SiC deposit layer and <0.08 μm/min for the SiC coating film (an etching amount of less than 5 μm/60 min), and the etching rate ratio of the SiC deposit layer relative to the SiC coating film was >6.3.

Example 6

With the exception of altering the gas composition to a $F_2$ concentration of 15 vol % and a $N_2$ concentration of 85 vol %, the cleaning test was performed under the same conditions as Example 1. As a result, the SiC deposit layer was reduced to 190 μm, but the SiC coating film was only reduced to 65 μm.

The etching rate was 1.0 μm/min for the SiC deposit layer and 0.083 μm/min for the SiC coating film, and the etching rate ratio of the SiC deposit layer relative to the SiC coating film was 12.

Example 7

With the exception of altering the temperature of the reaction tube to 400° C., the cleaning test was performed under the same conditions as Example 1. As a result, the SiC deposit layer was reduced to 190 μm, but the SiC coating film was only reduced to 65 μm.

The etching rate was 1.0 μm/min for the SiC deposit layer and 0.083 μm/min for the SiC coating film, and the etching rate ratio of the SiC deposit layer relative to the SiC coating film was 12.

Example 8

With the exceptions of altering the gas composition to a $F_2$ concentration of 1 vol % and a $N_2$ concentration of 99 vol %, and altering the flow time of the cleaning gas to 350 min, the cleaning test was performed under the same conditions as Example 1. As a result, the SiC deposit layer was reduced to 215 μm, but the SiC coating film was maintained at 70 μm. In other words, since the measurement limit here is 5 μm, the amount of reduction in the SiC coating film was less than 5 μm.

The etching rate was 0.10 μm/min for the SiC deposit layer and <0.014 μm/min for the SiC coating film (an etching amount of less than 5 μm/350 min), and the etching rate ratio of the SiC deposit layer relative to the SiC coating film was >7.1.

Example 9

With the exception of altering the gas composition to a $F_2$ concentration of 20 vol % and a $N_2$ concentration of 80 vol %, the cleaning test was performed under the same conditions as Example 1. As a result, the SiC deposit layer was reduced to 135 μm, but the SiC coating film was only reduced to 60 μm.

The etching rate was 1.9 μm/min for the SiC deposit layer and 0.17 μm/min for the SiC coating film, and the etching rate ratio of the SiC deposit layer relative to the SiC coating film was 11.

Comparative Example 1

A SiC coating film having a different crystalline orientation intensity, that is, having an intensity ratio of 80% for the (111) plane according to powder XRD analysis, was used as the SiC coating film for the in-furnace substrate. The intensity ratio of the crystal orientation (111) plane of the SiC deposit layer at that time was 52%.

With the exception of altering the flow time of the gas to 100 min, the cleaning test was performed under the same conditions as Example 1. The results of an SEM observation of the cross-sections revealed that the thicknesses of the SiC coating films were 70 μm, and the thickness of the deposit on the evaluation sample was approximately 250 μm, the same as Example 1.

As a result, the deposit layer was reduced to 70 μm, and the SiC coating film was also reduced to 10 μm.

The etching rate was 1.8 μm/min for the SiC deposit layer and 0.60 μm/min for the SiC coating film, and the etching rate ratio of the SiC deposit layer relative to the SiC coating film was 3.0.

Comparative Example 2

A SiC coating film having a different crystalline orientation intensity, that is, having an intensity ratio of 70% for the (111) plane according to powder XRD analysis, was used as the SiC coating film for the in-furnace substrate. The intensity ratio of the crystal orientation (111) plane of the SiC deposit layer at that time was 38%.

With the exception of altering the flow time of the gas to 100 min, the cleaning test was performed under the same conditions as Example 1. The results of an SEM observation of the cross-sections revealed that the thicknesses of the SiC coating films were 70 μm, and the thickness of the deposit on the evaluation sample was approximately 250 μm, the same as Example 1.

As a result, the SiC deposit layer was reduced to 60 μm, and the SiC coating film virtually disappeared such that only a small residue could be confirmed.

The etching rate was 1.9 μm/min for the SiC deposit layer and 0.70 μm/min for the SiC coating film, and the etching rate ratio of the SiC deposit layer relative to the SiC coating film was 2.7.

Comparative Example 3

With the exception of altering the temperature of the reaction tube to 550° C., the cleaning test was performed under the same conditions as Example 1. As a result, the SiC deposit layer was reduced to 200 μm, and the SiC coating film was also reduced to 50 μm.

The etching rate was 0.83/min for the SiC deposit layer and 0.17 μm/min for the SiC coating film, and the etching rate ratio of the SiC deposit layer relative to the SiC coating film was 4.9.

Comparative Example 4

With the exception of altering the temperature of the reaction tube to 150° C., the cleaning test was performed under the same conditions as Example 1. As a result, the SiC deposit layer was unchanged at 250 μm, and the SiC coating film was unchanged at 70 μm.

Comparative Example 5

With the exception of altering the gas composition to a $F_2$ concentration of 30 vol % and a $N_2$ concentration of 70 vol %, the cleaning test was performed under the same conditions as Example 1. As a result, the SiC deposit layer was reduced to 210 μm, and the SiC coating film was also reduced to 50 μm.

The etching rate was 0.67 μm/min for the SiC deposit layer and 0.17 μm/min for the SiC coating film, and the etching rate ratio of the SiC deposit layer relative to the SiC coating film was 3.9.

Comparative Example 6

With the exception of altering the gas composition to a $F_2$ volume concentration of 0.5% and a $N_2$ concentration of 99.5 vol %, the cleaning test was performed under the same conditions as Example 1. As a result, the SiC deposit layer was unchanged at 250 μm, and the SiC coating film was unchanged at 70 μm.

The results of the Examples and the Comparative Examples are summarized in Table 1.

TABLE 1

| | Etching gas (vol %) | | Reaction temperature (° C.) | Flow time (min) | Intensity ratio of (111) plane in powder XRD analysis | | Etching rate (μm/min) | | Etching rate ratio |
|---|---|---|---|---|---|---|---|---|---|
| | $F_2$ | Dilution gas | | | Deposit layer | Coating layer | Deposit layer | Coating layer | |
| Example 1 | 10 | $N_2$/90 | 280 | 60 | 76% | 99% | 0.67 | <0.08 | >8.4 |
| Example 2 | 10 | $N_2$/90 | 280 | 350 | 76% | 99% | >0.71 | 0.014 | >51 |
| Example 3 | 10 | $N_2$/90 | 280 | 200 | 73% | 95% | 0.78 | 0.020 | 39 |

TABLE 1-continued

| | Etching gas (vol %) | | Reaction temperature (° C.) | Flow time (min) | Intensity ratio of (111) plane in powder XRD analysis | | Etching rate (μm/min) | | Etching rate ratio |
|---|---|---|---|---|---|---|---|---|---|
| | $F_2$ | Dilution gas | | | Deposit layer | Coating layer | Deposit layer | Coating layer | |
| Example 4 | 10 | $N_2$/90 | 280 | 200 | 70% | 90% | 0.85 | 0.025 | 34 |
| Example 5 | 5 | $N_2$/95 | 280 | 60 | 76% | 99% | 0.50 | <0.08 | >6.3 |
| Example 6 | 15 | $N_2$/85 | 280 | 60 | 76% | 99% | 1.0 | 0.083 | 12 |
| Example 7 | 10 | $N_2$/90 | 400 | 60 | 76% | 99% | 1.0 | 0.083 | 12 |
| Example 8 | 1 | $N_2$/99 | 280 | 350 | 76% | 99% | 0.10 | <0.014 | >7.1 |
| Example 9 | 20 | $N_2$/80 | 280 | 60 | 76% | 99% | 1.9 | 0.17 | 11 |
| Comparative Example 1 | 10 | $N_2$/90 | 280 | 100 | 52% | 80% | 1.8 | 0.60 | 3.0 |
| Comparative Example 2 | 10 | $N_2$/90 | 280 | 100 | 38% | 70% | 1.9 | 0.70 | 2.7 |
| Comparative Example 3 | 10 | $N_2$/90 | 550 | 60 | 76% | 99% | 0.83 | 0.17 | 4.9 |
| Comparative Example 4 | 10 | $N_2$/90 | 150 | 60 | 76% | 99% | — | — | — |
| Comparative Example 5 | 30 | $N_2$/70 | 280 | 60 | 76% | 99% | 0.67 | 0.17 | 3.9 |
| Comparative Example 6 | 0.5 | $N_2$/99.5 | 280 | 60 | 76% | 99% | — | — | — |

Comparing Example 1 and Comparative Example 4, it was evident that even at the same fluorine gas concentration and flow time as Example 1, etching of the SiC deposit cannot be performed at a reaction temperature of 150° C. Furthermore, comparing Example 1 and Comparative Example 3, it was evident that even at the same fluorine gas concentration and flow time as Example 1, a sufficient etching rate ratio cannot be obtained at a reaction temperature of 550° C.

Comparing Example 1 and Comparative Example 6, it was evident that even at the same reaction temperature and flow time as Example 1, etching of the SiC deposit cannot be performed at a fluorine gas concentration of 0.5 vol %. Furthermore, comparing Example 1 and Comparative Example 5, it was evident that even at the same reaction temperature and flow time as Example 1, a sufficient etching rate ratio cannot be obtained at a fluorine gas concentration of 30 vol %.

Comparing Example 1, Comparative Example 1 and Comparative Example 2, it was evident that, in the powder XRD analysis of the 3C—SiC polycrystal constituting the surface of the in-furnace substrate, at an intensity ratio of the (111) plane with respect to the other crystalline planes of less than 85%, a sufficient etching rate ratio could not be obtained.

DESCRIPTION OF THE REFERENCE SIGNS

1: Reaction tube
2: Fluorine gas supply unit
3: Dilution gas supply unit
4: Exhaust unit
5: Induction heating coil
6: Sample mounting stage
7: Sample

The invention claimed is:

1. A method of cleaning a SiC monocrystal growth furnace using a gas to clean a SiC monocrystal growth furnace provided with an in-furnace substrate composed of a 3C—SiC polycrystal having at least a surface in which an intensity ratio of a (111) plane with respect to other crystal planes is at least 85% but not more than 100% according to powder XRD analysis, the method comprising:
flowing a mixed gas which consists of $F_2$ gas and an inert gas in a non-plasma state through an inside of the SiC monocrystal growth furnace, thereby selectively removing a SiC deposit deposited inside the SiC monocrystal growth furnace,
wherein the SiC deposit is a 3C—SiC polycrystal having an intensity ratio of the (111) plane with respect to the other crystal planes of less than 85% according to powder XRD analysis, and
wherein the mixed gas comprises at least 1 vol % but not more than 20 vol % of $F_2$ gas, and at least 80 vol % but not more than 99 vol % of the inert gas,
wherein a temperature of the inside the SiC monocrystal growth furnace is at least 200° C. but not more than 500° C., and
wherein the in-furnace substrate comprises an inner wall and members of the SiC monocrystal growth furnace.

2. The method of cleaning a SiC monocrystal growth furnace according to claim 1, wherein a temperature inside the SiC monocrystal growth furnace is 280° C.-400° C.

3. The method of cleaning a SiC monocrystal growth furnace according to claim 1, wherein the inert gas is selected from the group consisting of nitrogen gas, argon gas and helium gas.

4. A method of cleaning a SiC monocrystal growth furnace by using a gas to clean a SiC monocrystal growth furnace provided with an in-furnace substrate composed of a 3C—SiC polycrystal having at least a surface in which an intensity ratio of a (111) plane with respect to other crystal planes is at least 85% but not more than 100% according to powder XRD analysis, the method comprising:
flowing a mixed gas in a non-plasma state through an inside of the SiC monocrystal growth furnace, thereby selectively removing a SiC deposit deposited inside the SiC monocrystal growth furnace,
wherein the SiC deposit is a 3C—SiC polycrystal having an intensity ratio of the (111) plane with respect to the other crystal planes of less than 85% according to powder XRD analysis, wherein the mixed gas comprises at least 1 vol % but not more than 20 vol % of $F_2$ gas, and at least 80 vol % but not more than 99 vol % of the inert gas, and a temperature of the inside the SiC monocrystal growth furnace is 280° C. 400° C., wherein the in-furnace substrate comprises an inner wall and members of the SiC monocrystal growth furnace, and wherein the mixed gas consists of $F_2$ gas and an inert gas, or consists of $F_2$ gas, an inert gas and air.

5. The method of cleaning a SiC monocrystal growth furnace according to claim 4, wherein the inert gas is nitrogen gas.

6. The method of cleaning a SiC monocrystal growth furnace according to claim 4, wherein the inert gas is selected from the group consisting of nitrogen gas, argon gas and helium gas.

7. The method of cleaning a SiC monocrystal growth furnace according to claim 6, wherein the inert gas is either nitrogen gas or argon gas.

8. A method of cleaning a SiC monocrystal growth furnace using a gas to clean a SiC monocrystal growth furnace provided with an in-furnace substrate composed of a 3C—SiC polycrystal having at least a surface in which an intensity ratio of a (111) plane with respect to other crystal planes is at least 85% but not more than 100% according to powder XRD analysis, the method comprising:

flowing a mixed gas which consists of $F_2$ gas and at least one of an inert gas and air in a non-plasma state through an inside of the SiC monocrystal growth furnace, thereby selectively removing a SiC deposit deposited inside the SiC monocrystal growth furnace, wherein the SiC deposit is a 3C—SiC polycrystal having an intensity ratio of the (111) plane with respect to the other crystal planes of less than 85% according to powder XRD analysis, wherein the mixed gas comprises at least 1 vol % but not more than 20 vol % of $F_2$ gas, and at least 80 vol % but not more than 99 vol % of the inert gas, and a temperature of the inside the SiC monocrystal growth furnace is at least 200° C. but not more than 500° C., and wherein the in-furnace substrate comprises an inner wall and members of the SiC monocrystal growth furnace.

9. The method of cleaning a SiC monocrystal growth furnace according to claim 8, wherein a temperature inside the SiC monocrystal growth furnace is 280° C. 400° C.

10. The method of cleaning a SiC monocrystal growth furnace according to claim 8, wherein the mixed gas consists of $F_2$ gas, the inert gas and the air.

11. The method of cleaning a SiC monocrystal growth furnace according to claim 8, wherein the inert gas is nitrogen gas.

12. The method of cleaning a SiC monocrystal growth furnace according to claim 8, wherein the mixed gas consists of $F_2$ gas and the inert gas, or consists of $F_2$ gas, the inert gas and the air.

13. The method of cleaning a SiC monocrystal growth furnace according to claim 8, wherein the inert gas is selected from the group consisting of nitrogen gas, argon gas and helium gas.

14. The method of cleaning a SiC monocrystal growth furnace according to claim 13, wherein the inert gas is either nitrogen gas or argon gas.

* * * * *